United States Patent
Quinlan

(10) Patent No.: US 6,885,324 B1
(45) Date of Patent: Apr. 26, 2005

(54) METHOD AND APPARATUS FOR TESTING OR CALIBRATING AN ANALOG TO DIGITAL CONVERTER USING A PHASE LOCKED LOOP

(75) Inventor: Sion Quinlan, Goring on Thame (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/345,568

(22) Filed: Dec. 13, 1999

(30) Foreign Application Priority Data

Jun. 30, 1998 (GB) .............................. 9814188

(51) Int. Cl.[7] .......................... H03M 1/10; H03M 1/06; H03D 3/24
(52) U.S. Cl. ....................... 341/120; 341/118; 375/376
(58) Field of Search ................................ 341/120, 118, 341/139; 331/17; 375/376, 377; 327/147, 157, 158; 455/164.1

(56) References Cited

U.S. PATENT DOCUMENTS

| | | | | | |
|---|---|---|---|---|---|
| 4,291,414 A | * | 9/1981 | Kimura | .................... | 455/164.1 |
| 5,319,370 A | * | 6/1994 | Signore et al. | ............. | 341/120 |
| 5,578,968 A | * | 11/1996 | Mori et al. | .................. | 331/1 A |
| 5,724,105 A | * | 3/1998 | Hatano | ....................... | 348/725 |
| 5,796,358 A | * | 8/1998 | Shih et al. | ................... | 341/139 |
| 5,909,186 A | * | 6/1999 | Gohringer | ................... | 341/120 |
| 5,920,214 A | * | 7/1999 | Lee et al. | ................... | 327/147 |
| 6,084,480 A | * | 7/2000 | Uneme | ........................ | 331/17 |
| 6,097,227 A | * | 8/2000 | Hayashi | ....................... | 327/158 |
| 6,118,344 A | * | 9/2000 | Toshitani et al. | ........... | 331/1 R |
| 6,140,881 A | * | 10/2000 | Kim | ............................. | 331/20 |
| 6,222,421 B1 | * | 4/2001 | Kiyose | ......................... | 331/17 |
| 6,289,070 B1 | * | 9/2001 | Krone et al. | ................. | 375/377 |
| 6,377,646 B1 | * | 4/2002 | Sha | ............................. | 375/376 |
| 6,594,330 B1 | * | 7/2003 | Wilson | ....................... | 375/376 |
| 2002/0190765 A1 | * | 12/2002 | Matsunami et al. | ......... | 327/156 |

FOREIGN PATENT DOCUMENTS

GB          2 106 732 A         4/1983

* cited by examiner

*Primary Examiner*—Patrick Wamsley
(74) *Attorney, Agent, or Firm*—Conley Rose, P.C.

(57) ABSTRACT

A method of testing or calibrating analog to digital converters in a digital test environment comprising: providing a phase lock loop having a voltage controlled oscillator, and calibrating the phase lock loop in terms of the relation between the input voltage to the voltage controlled oscillator and the frequency of the loop; providing in the phase lock loop a digital comparison means providing an output to a charge pumping means which provides a voltage to the input of a voltage controlled oscillator; applying a predetermined code to one input of the digital comparison means and applying the output code of an analog to digital converter to a further input of the digital comparison means, and applying the input voltage to the voltage controlled oscillator to the input of the analog to digital converter; and when equality is established between the digital codes applied to the inputs of the digital comparison means, and the frequency of the phase lock loop is constant, measuring the frequency of the phase lock loop.

5 Claims, 2 Drawing Sheets

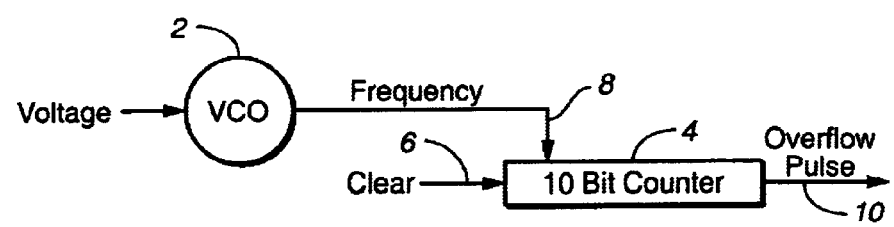
FIG._1
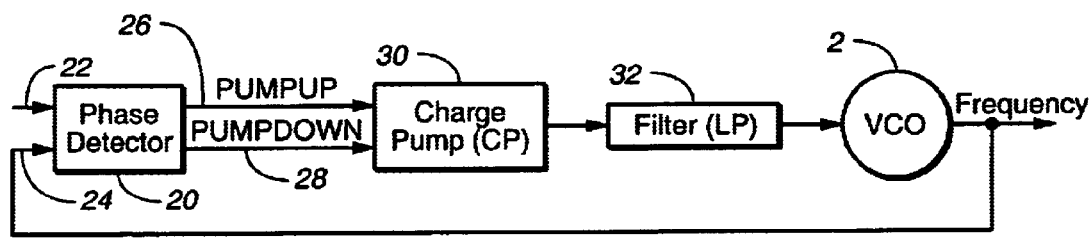
FIG._2

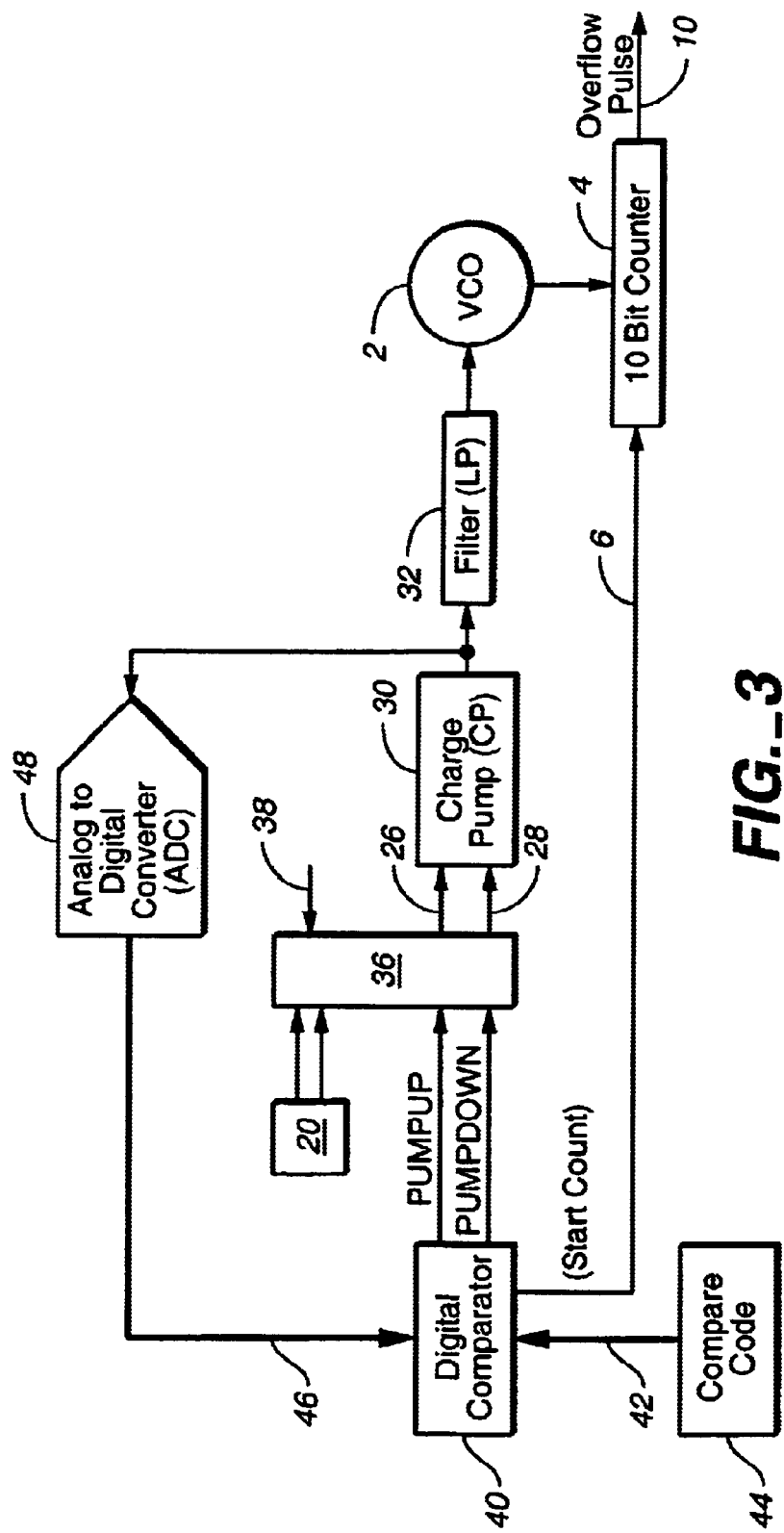
FIG._3

METHOD AND APPARATUS FOR TESTING OR CALIBRATING AN ANALOG TO DIGITAL CONVERTER USING A PHASE LOCKED LOOP

The present invention relates to method and apparatus for testing or calibrating analog to digital converters.

The automatic evaluation of the static performance of an analog to digital converter has previously relied on setting an analog voltage having a value which is accurately determined on the input to the ADC, and then reading the digital code output from the ADC. This means that an accurate voltage source is required, which implies that the source must have a resolution greater than 1 mv for an 8 bit ADC. Such an accurate analog voltage source is not always available in a digital testing environment.

SUMMARY OF THE INVENTION

The basis of the present invention is to measure the static performance of an analog to digital converter by incorporating the analog to digital converter into an accurately calibrated phase lock loop. In an accurately calibrated phase lock loop, the relationship between the input voltage applied to the voltage control oscillator and the frequency of the loop is known accurately. Thus, by providing the input voltage to the voltage control oscillator as an input to the analog to digital converter, and reading the output code, the output code can be related to the frequency of the loop, and thus to the input voltage to the analog to digital converter.

Accordingly, in a first aspect, the present invention provides a method of testing or calibrating an analog to digital converter, comprising:

1) providing a phase lock loop having a voltage control oscillator, and calibrating the phase lock loop in terms of the relation between the input voltage to the voltage control oscillator and the frequency of the loop;
2) applying the input voltage to the voltage controlled oscillator to the input of an analog to digital conveyor, and reading the digital output code of the analog to digital converter; and
3) monitoring the frequency of the phase lock loop whereby to relate the input voltage of the analog to digital converter to the output digital code of the converter.

In a preferred embodiment, the testing of the analog to digital converter is carried out by means of a digital tester which provides a digital output code for comparison with the output code of the analog to digital converter, and measures the frequency of the phase lock loop by measuring the time interval taken for the phase lock loop frequency to fill a counter. In this embodiment, a digital comparator is provided for comparing the output code from the digital tester with the output code from the analog to digital converter, and this digital comparator is substituted for the phase detector normally provided in the phase lock loop. The output of the digital comparator is applied to a charge pumping device for providing a DC voltage to the voltage control oscillator, with DC voltage is also applied to the analog to digital converter. The digital tester applies a predetermined code to the comparator, and the output voltage varies, and with it the frequency of the phase lock loop, until the output of the analog to digital converter equals the code provided by the digital tester. At this point, a counter is started and the time interval taken for the frequency of the loop to fill the counter is measured, whereby to determine the frequency of the phase lock loop.

Accordingly, in a second aspect, the present invention provides a method of testing or calibrating an analog to digital converter, comprising:

1) providing a phase lock loop having a voltage controlled oscillator, and calibrating the phase lock loop in terms of the relation between the input voltage to the voltage controlled oscillator and the frequency of the loop;
2) providing in the phase lock loop a digital comparison means providing an output to a charge pumping means which provides a voltage to the input of a voltage controlled oscillator;
3) applying a predetermined code to one input of the digital comparison means and applying the output code of an analog to digital converter to a further input of the digital comparison means, and applying the input voltage to the voltage controlled oscillator to the input of the analog to digital converter; and
4) when equality is established between the digital codes applied to the inputs of the digital comparison means, and the frequency of the phase lock loop is constant, measuring the frequency of the phase lock loop.

In a third aspect, the present invention provides apparatus for calibrating an analog to digital converter, the apparatus including a phase lock loop, the phase lock lop including:
a digital comparison means for receiving at a first input a reference digital input and for receiving at a second input the output of an analog to digital converter, the output of the digital comparison means being coupled to conversion means for providing an analog voltage for application to the input of the analog to digital converter and for application to the input of a voltage controlled oscillator, the frequency output of the voltage controlled oscillator being coupled to frequency measurement means, and the digital comparison means being arranged to provide a start signal to the frequency measurement means when equality is achieved between the digital codes applied to the inputs of the digital comparison means.

As preferred, the frequency measurement means comprises a counter and the time interval taken for the counter to fill and provide an overflow pulse is measured, whereby to determine the frequency of the phase lock loop.

BRIEF DESCRIPTION OF THE DRAWINGS

A preferred embodiment of the invention will now be described with reference to the accompanying drawings wherein:

FIG. 1 is a schematic block diagram of a method of measured the frequency of a phase lock loop;

FIG. 2 is a schematic block diagram of a known form of phase lock loop; and

FIG. 3 is a schematic block diagram of a preferred embodiment of the present invention comprising a phase lock loop modified to calibrate an analog to digital converter.

DESCRIPTION OF THE PREFERRED EMBODIMENT

Referring to FIG. 1, a method of measuring the frequency performance of a phase lock loop (PLL) is shown wherein a voltage controlled oscillator 2 of the PLL has a frequency signal output applied to the input of a 10 bit counter 4. The counter may be integrated with the PLL in a single integrated circuit. In operation, the counter is cleared by means of a signal applied to a clear input 6 and the oscillator frequency signal is applied to an input 8 of the counter. When the counter if filled, an overflow pulse is generated at 10.

A digital tester device is arranged for applying the clear pulse to the input 6 and detecting the overflow pulse at 10. The digital tester measures the time for the counter to fill and provide the overflow pulse, and thereby determines the frequency of oscillation of the loop.

The phase lock loop structure is shown in more detail in FIG. 2 as comprising a phase detector (or phase/frequency detector) (PFD) 20 for comparing a reference signal applied at input 22 with the output frequency signal of VCO 2 applied at input 24. The PFD 20 provides two outputs, depending on the result of the comparison of the two inputs as a PUMP-UP signal on line 26 or a PUMP-DOWN signal on line 28. These two signals are applied to a charge pump device 30 which produces an analog voltage from the input signals. The analog voltage output from the charge pump device is applied through a loop filter 32 to the input of VCO 2.

Referring now to FIG. 3, this shows the preferred embodiment of the present invention, wherein similar parts to those of the preceding figures are identified by the same reference numerals. In FIG. 3, the phase detector 20 of FIG. 2 is coupled to one input of a multiplexer 36 having a control input 38. A digital comparator 40 is connected to the other input of the multiplexer, the output of the multiplexer providing a PUMP-UP signal on line 26 and PUMP-DOWN signal on line 28. A first input 42 of the digital comparator is coupled to a digital tester, indicated schematically at 44 for providing a predetermined reference or comparison code to the comparator. A second input 46 of the digital comparator is coupled to the output of an analog to digital converter 48 under test. The analog input to the converter 48 is connected to the output of the charge pump circuit 30.

In operation, the testing measurement of the analog to digital converter 48 is carried out as follows. Firstly, in a preliminary operation, the phase lock loop is calibrated with multiplexer 36 connecting PFD in circuit so that the relation between the voltage input to VCO 2 and the PLL frequency is accurately known. The control input on line 38 is then actuated to switch digital comparator 40 in circuit. The loop filter 32 is shorted to earth so that the VCO 2 is directly responsive to the voltage of the output of charge pulse device 30.

The analog to digital converter 48 is then connected in the circuit as shown and an initial code (greater than 00H) is applied from digital tester 44 to input 42 of digital comparator 40. If this code is greater than the output code existing at the output of analog to digital converter 48, then a signal is provided on PUMP-UP line 26 to provide a positive increment to the output voltage of charge pump device 30. However, should this code be less, then a signal is provided on PUMP_DOWN line 28 to provide a reduction in the output voltage of the charge pump device 30. By supplying both increments and decrements, the voltage on the input to the ADC 48 will eventually cause the output digital code of the ADC 48 to be equal to the digital code on the digital comparator 40 caused by the digital tester 44. This increase in voltage increases via VCO 2, the frequency of the PLL, and also increases the value of the output code ADC 48. The output voltage of charge pump 30 continues to increase until the output code of ADC 48 equals the code applied to the input 42 by tester 44. When the codes are equal, a signal is provided by digital comparator 40 on start count line 6 to initialise counter 4. The counter then counts the frequency cycles of VCO 2 until the counter is full, when an overflow pulse is provided on line 10. Both the start count signal on line 6 and the overflow pulse on line 10 are detected by a digital tester 44 which is then operative to determine the time interval for filling the counter 4, and thence the frequency of oscillation of VCO 2.

Since in the preliminary operation, the phase lock loop has been calibrated, the ADC input voltage for the code provided by tester 44 and be determined.

By stepping through the possible output codes from the ADC, as provided by digital tester 44 to input 42, the static performance of the ADC can be determined over its entire range.

The advantage of such a method is that the measurement of time intervals is a well established procedure with digital testers and therefore the implementation of such a method requires little departure from the traditional digital test methods. Also since most systems employing an ADC in addition use a PLL for system timing, the addition of the digital comparator is all that is required for implementation of the present invention.

What is claimed is:

1. A method of testing or calibrating an analog to digital converter, comprising:
   1) providing a phase lock loop having a voltage controlled oscillator, and calibrating the phase lock loop in terms of the relationship between the input voltage to the voltage controlled oscillator and the frequency of the loop;
   2) applying the input voltage to the voltage controlled oscillator to the input of an analog to digital converter, and reading the digital output code of the analog to digital converter; and
   3) monitoring the frequency of the phase lock loop whereby to relate the input voltage of the analog to digital converter to the output digital code of the converter.

2. A method of testing or calibrating an analog to digital converter, comprising:
   1) providing a phase lock loop having a voltage controlled oscillator, and calibrating the phase lock loop in terms of the relationship between the input voltage to the voltage controlled oscillator and the frequency of the loop;
   2) providing in the phase lock loop a digital comparison means providing an output to a charge pumping means which provides a voltage to the input of a voltage controlled oscillator;
   3) applying a predetermined code to one input of the digital comparison means and applying the output code of an analog to digital converter to a further input of the digital comparison means, and applying the input voltage to the voltage controlled oscillator to the input of the analog to digital converter; and
   4) when equality is established between the digital codes applied to the inputs of the digital comparison means, and the frequency of the phase lock loop is constant, measuring the frequency of the phase lock loop.

3. Apparatus for calibrating an analog to digital converter, the apparatus including a phase lock loop, the phase lock loop including:

a digital comparison means for receiving at a first input a reference digital input and for receiving at a second input the output of an analog to digital converter, the output of the digital comparison means being coupled to conversion means for providing an analog voltage for application to the input of the analog to digital converter and for application to the input of a voltage controlled oscillator, the frequency output of the voltage controlled oscillator being coupled to frequency measurement means, and the digital comparison means being arranged to provide a start signal to the frequency measurement means when equality is achieved between the digital codes applied to the inputs of the digital comparison means.

4. Apparatus according to claim 3, including a phase detector coupled to the first input of a multiplexer means, and the digital comparison means connected to a second input of the multiplexer, the output of the multiplexer being connected to a charge pump means.

5. Apparatus according to claim 3, wherein the frequency measurement means comprises a counter arranged to count cycles of the loop frequency when the digital comparison means provides said start signal, and the counter being arranged to provide a stop signal upon a predetermined count.

\* \* \* \* \*